(12) United States Patent
Kent et al.

(10) Patent No.: US 6,594,599 B1
(45) Date of Patent: Jul. 15, 2003

(54) SYSTEM, WORK STATION AND METHOD FOR TESTING A PRODUCT AND GENERATING A STATISTICAL MODEL THAT PREDICTS THE PROCESSIBILITY OF MAKING LIKE PRODUCTS

(75) Inventors: Kevin B. Kent, Terrell, TX (US); Timothy D. Burroughs, Richardson, TX (US)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/851,872

(22) Filed: May 9, 2001

(51) Int. Cl.[7] .............................................. G06F 19/00
(52) U.S. Cl. ........................................ 702/84; 395/183
(58) Field of Search ..................... 702/84, 161; 714/38, 714/718; 29/407.01; 73/150 A, 37; 345/156, 159; 700/108

(56) References Cited

U.S. PATENT DOCUMENTS

| | | | | |
|---|---|---|---|---|
| 4,988,981 A | * | 1/1991 | Zimmerman et al. | 345/156 |
| 5,297,059 A | * | 3/1994 | Kawasoe | 702/121 |
| 5,539,652 A | * | 7/1996 | Tegethoff | 700/108 |
| 5,815,654 A | * | 9/1998 | Bieda | 714/38 |
| 5,938,779 A | * | 8/1999 | Preston | 714/718 |
| 6,108,887 A | * | 8/2000 | Ponamgi et al. | 29/407.01 |
| 6,349,588 B1 | * | 2/2002 | Brown et al. | 73/150 A |

* cited by examiner

Primary Examiner—Kamini Shah
Assistant Examiner—Xiuqin Sun
(74) Attorney, Agent, or Firm—William J. Tucker; V. Lawrence Sewell; Jessica W. Smith

(57) ABSTRACT

A system, work station, and method are described that can characterize a new product including, for example, an electronic circuit board. Basically, the system includes a work station that interacts with and controls one or more pieces of test equipment to test a product (electronic circuit board) under a variety of conditions (e.g., temperature, voltage). While testing the product, the work station collects a wide variety of test data from the different pieces of test equipment. After testing the product, the work station then analyzes the collected test data and generates a statistical model that predicts the permissibility of making a like product that can be provided to a manufacturer who can then use the statistical model to help mass-produce and test like products.

15 Claims, 9 Drawing Sheets

SYSTEM, WORK STATION AND METHOD FOR TESTING A PRODUCT AND GENERATING A STATISTICAL MODEL THAT PREDICTS THE PROCESSIBILITY OF MAKING LIKE PRODUCTS

BACKGROUND OF THE INVENTION

1. Field of the Invention

The present invention relates in general to a system, work station and method capable of testing a product and generating a statistical model which predicts the permissibility of making like products that can be provided to a manufacturer who can then use the statistical model to effectively mass-produce and test like products.

2. Description of Related Art

Today when a company designs and builds a product such as an electronic circuit board they often perform a series of tests on the product to characterize that product before mass-producing like products. The characterization of the product results in the generation of a statistical model which predicts the permissibility of making like products that can be used by a manufacturer to effectively mass-produce and test like products. In other words, the statistical model provides data (e.g., nominal, lower and upper test conditions) about a product that a manufacturer can use to test some or all of their mass-produced products to determine if they are functional and satisfy predetermined standards. Traditionally, engineers (or technicians) would have to spend a great deal of time to characterize new products. To characterize new products, the engineers would have to manually change settings on test equipment (e.g. Power supplies) and manually read, write-down, and analyze the results of the tests in order to generate the statistical model.

FIG. 1 (PRIOR ART) is a block diagram illustrating a traditional system 100 including one or more pieces of test equipment 102 that the engineer must manually interact with before being able to manually characterize a new product 104 (shown as a Unit Under Test (UUT)). In particular, the engineer must manually interact with and change the settings of one or more pieces of test equipment 102 (e.g. Power supply and temperature chamber) and then record the measured output of one or more pieces of test equipment 102 before being able to analyze the test results and characterize the UUT 104. For example, before the engineer can manually characterize the UUT 104, the engineer must make incremental changes to the voltage output of a particular piece of equipment 102 (e.g., power supply) that is input to the UUT 104 and then record the incremental changes to an output of the UUT 104 until the UUT 104 is no longer functional. The test equipment 102. Is connected to the UUT 104 using cables 106 (e.g. Power cables, optical cables, co-axial cables). This manual process takes time and is prone to errors, especially when the engineer must manually change and monitor the settings and outputs of several pieces of test equipment at the same time.

Accordingly, there is and has been a need for a system, work station and method than can automatically test a product, collect test data and analyze the collected test data to generate a statistical model which predicts the permissibility of making like products. This need and other needs are satisfied by the system, work station and method of the present invention.

BRIEF DESCRIPTION OF THE INVENTION

The present invention includes a system, work station and method capable of characterizing a new product including, for example, an electronic circuit board. Basically, the system includes a work station that interacts with and controls one or more pieces of test equipment to test a product under a variety of conditions (e.g., temperature, voltage). While testing the product, the work station collects a wide variety of test data from the different pieces of test equipment. After testing the product, the work station then analyzes the collected test data and generates a statistical model that predicts the permissibility of making a like product that can be provided to a manufacturer who can then use the statistical model to help mass-produce and test like products.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Referring to FIGS. 2–18, there are disclosed a preferred embodiment of a system 200, work station 210 and method 300 that can characterize a product in accordance with the present invention. Although the present invention is described as being able to characterize a product such as an optical interface card or an electrical interface card both of which are used in a cross-connect switch, it should be understood that the present invention can be used to characterize a wide variety of electronic circuit boards. Accordingly, the system 200, work station 210 and method 300 should not be construed in a limited manner.

Figure 1:
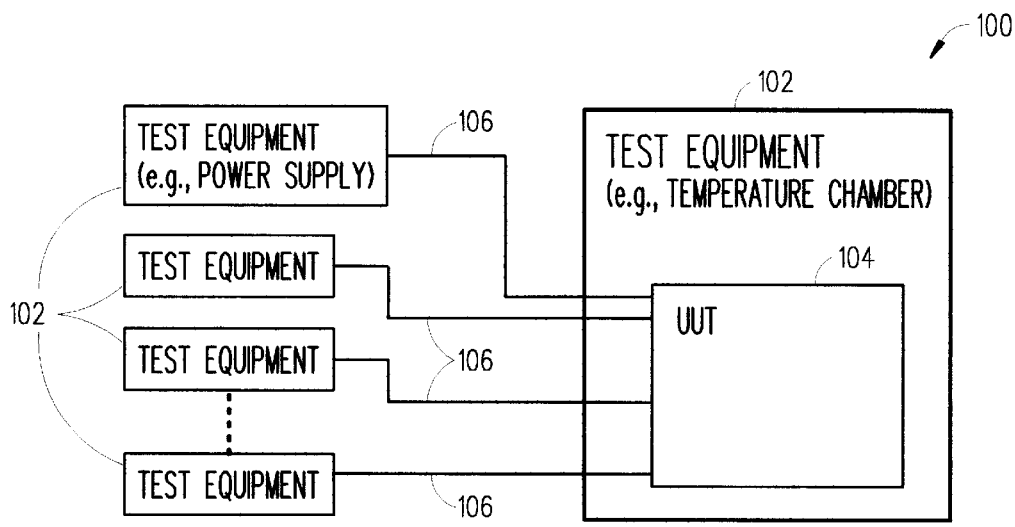
FIG. 1 (PRIOR ART) is a block diagram that illustrates a traditional system that a person (e.g., engineer) must use to manually characterize a new product.
Figure 2:
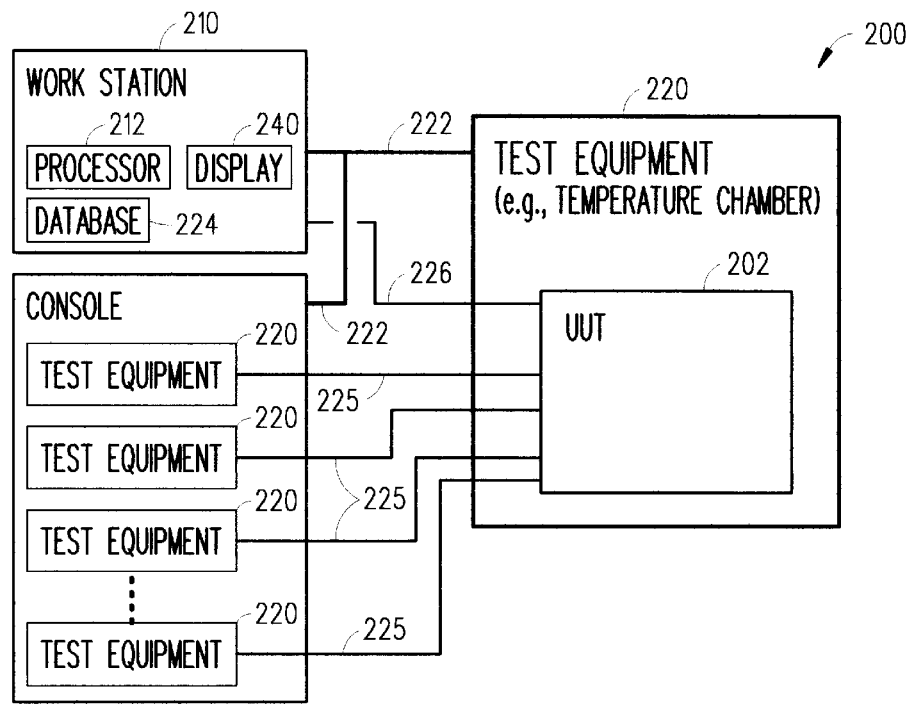
FIG. 2 is a block diagram illustrating the basic components of a system that can characterize a new product in accordance with the present invention.
Figure 3:
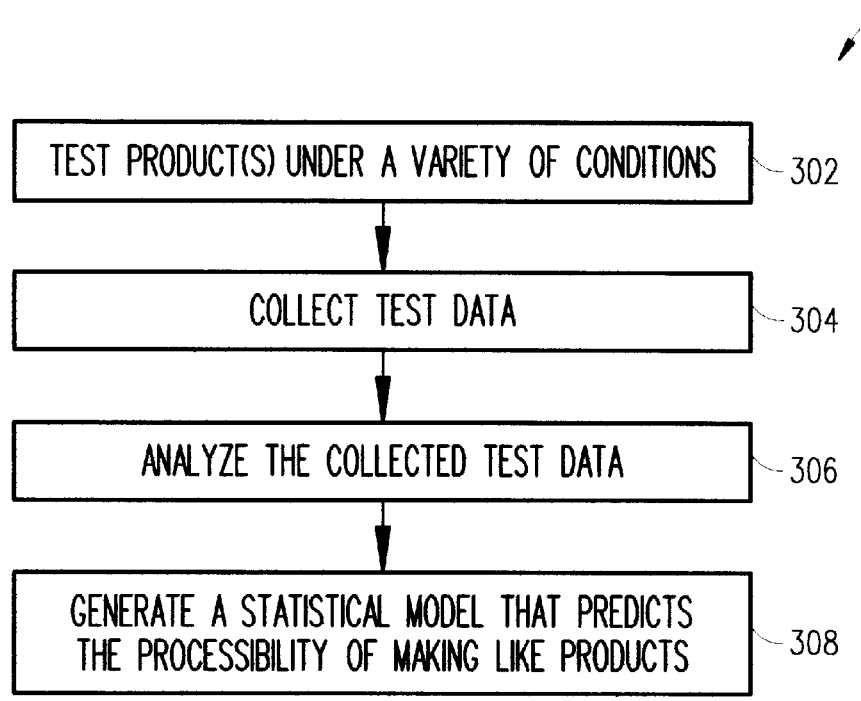
FIG. 3 is a flowchart illustrating the basic steps of a preferred method for characterizing a new product in accordance with the present invention.

Referring to FIGS. 2 and 3, there are respectively illustrated an exemplary system 200 and preferred method 300 in accordance with the present invention. The system 200 includes a work station 210 and one or more pieces of test equipment 220 which can operate together to characterize a product 202 (e.g., Unit Under Test (UUT) or module). In particular, each piece of test equipment 220 is capable of being controlled by a processor 212 within the work station 210 to test (step 302) at least one product 202 (only one shown) under a variety of conditions (e.g., temperatures, voltages). The testing step 302 is described in greater detail below with respect to FIG. 4.

Figure 4:
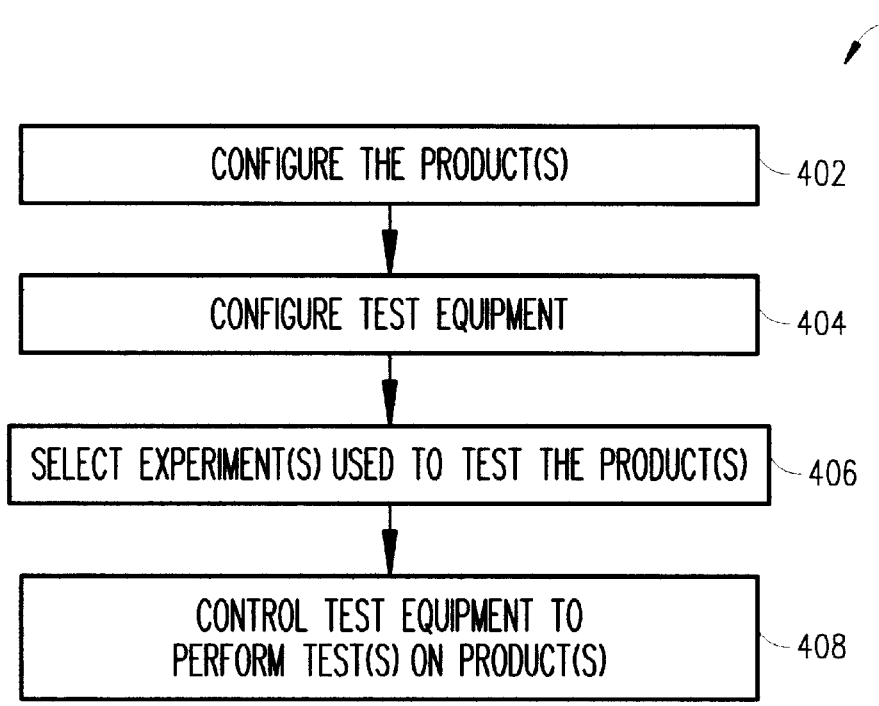
FIG. 4 is a flowchart illustrating in greater detail the operations of the testing step of the preferred method shown in FIG. 3.

Referring to FIG. 4, there is a flowchart illustrating in greater detail the operations of the testing step 302 of the preferred method 300 shown in FIG. 3. The user interfaces with the work station 210 to configure (step 402) the product 202, to configure (step 404) the test equipment 220 and to select (step 406) the various experiments that are used to test the product 202. The type of information the work station 210 needs in order to configure the product 202 includes, for example, the type of product 202 (e.g., optical interface board, electrical interface board), the number of products 202 being tested, the control interface to be used and the modes of operation. And, the user needs to interface with the work station 210 to configure one or more pieces of test equipment 220 (also referred herein as console) to perform a variety of tests on the product 202. Lastly, the type of information the work station 210 needs in order to configure the experiments includes, for example, the variables and the variable names that make up a Taguchi Matrix (described in detail below). To help the work station 210 configure these things, a user would interface with a graphical user interface (GUI) 240 associated with the work station 210. The GUI 240 (display) is described in greater detail below with respect to FIG. 9.

At step 408, the work station 210 controls one or more pieces of test equipment 220 to perform the different tests on the product 202. To accomplish this, the work station 210 can use a General Purpose Interface Bus (GPIB) 222 to interface with and control the different pieces of test equipment 220. The GPIB 222 enables the work station 210 to interface with and control each piece of test equipment 220 instead of requiring a person to manually interface with and control each piece of test equipment 220 like in the state-of-the art. Preferably, the work station 210 can use a graphical programming language such as LabVIEW® to interface with and control each piece of test equipment 220. In particular, the work station 210 can effectively turn one or more pieces of test equipment 220 into a Virtual Instrument (VI) by taking functions from different pieces of test equipment 220 to perform a particular task. In addition to the GPIB 222, the work station 210 can use a cable 226 (e.g. serial RS-232 cable) to communicate during the test with the product 202. Test equipment 220 are connected to the product 202 using cables 225 (e.g., power cables, optical cables, co-axial cables). Typical pieces of test equipment 220 include, for example, an optical attenuator, a polarization controller, an error performance analyzer, an optical spectrum analyzer, an oscilloscope, an optical power meter, an optical jitter tester, a power supply and a temperature chamber (see also Table A).

Referring back to FIGS. 2 and 3, the work station 210 collects (step 304) the test data generated in response, to performing. different tests on the product 202 using one or more pieces of test equipment 220. The collected test data can be stored in a database 224. The work station 210 can also check the validity of the test data while the test data is being collected or after the test data has been collected.

After the tests have been completed and the validity of the collected data has been checked by the work station 210, the work station 210 can then analyze (step 306) the collected test data and generate (step 308) a statistical model that can be used, for example, by a manufacturer to predict the permissibility of making like products. In particular, the manufacturer can use the statistical model to help mass-produce and test like products. Basically, the statistical model includes information such as the nominal, upper and lower limits of particular measurements (e.g., temperature, voltage) which the manufacturer can use to test a product. After testing some products, the manufacturer can predict the failure they will have in producing these products. The analyzing step 306 is described in greater detail below with respect to FIGS. 5 and 6.

Figure 5:
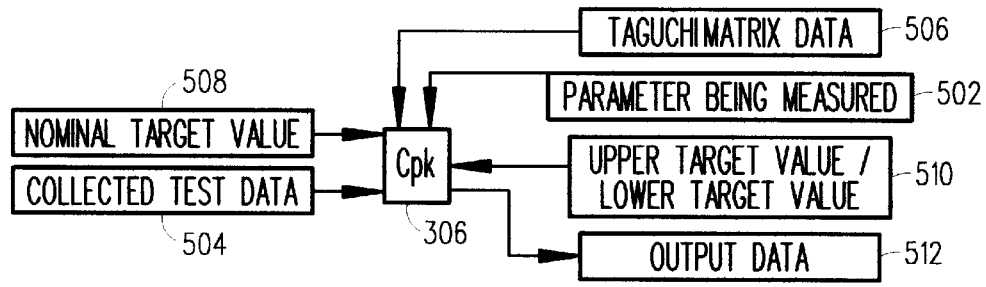
FIG. 5 is a block diagram illustrating the various inputs and outputs associated with the analyzing step of the preferred method shown in FIG. 3.
Figure 6:
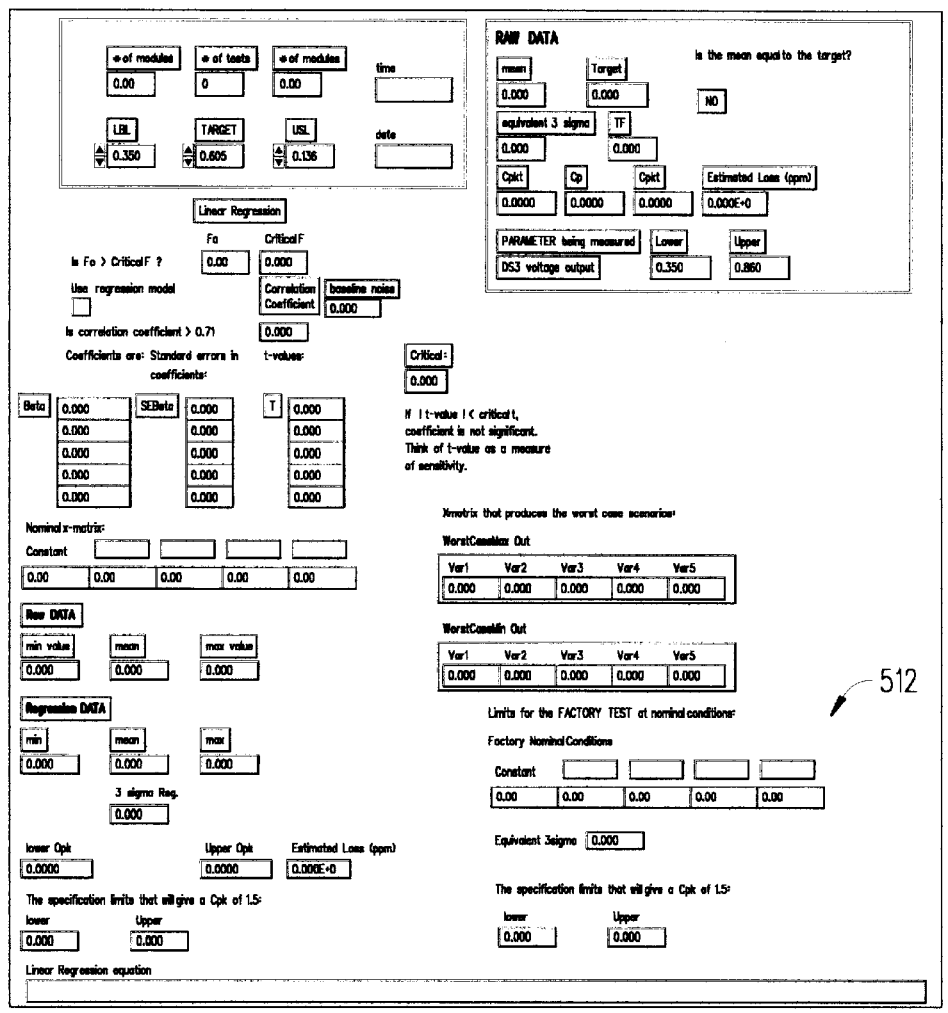
FIG. 6 is a diagram illustrating an exemplary display of a work station of the system showing the various inputs and outputs of the analyzing step shown in FIG. 5.

Referring to FIGS. 5 and 6, there are respectively shown a block diagram illustrating the various inputs and outputs associated with the analyzing step 306 (e.g., Cpk program or Virtual Instrument) and an exemplary display 600 of the work station 210 showing the inputs and outputs of the analyzing step 306. As show in FIGS. 5 and 6, the data that is provided to the analyzing step 306 includes the parameter being measured 502, the collected test data 504, and the data from the Taguchi matrix 506 (described below). In addition, the user inputs a nominal target value 508, and upper target and lower target values 510 into the analyzing step 306. Then the analyzing step 306 can use a graphical programming language such as LabVIEW® to analyze the various inputs and output the nominal, lower and upper test conditions 512 that are part of the statistical model. Of course, the particular analysis performed during the analyzing step 306 depends on the particular test being run, the particular type of product 202 being tested, and the type of data input into the analyzing program.

Figure 7:
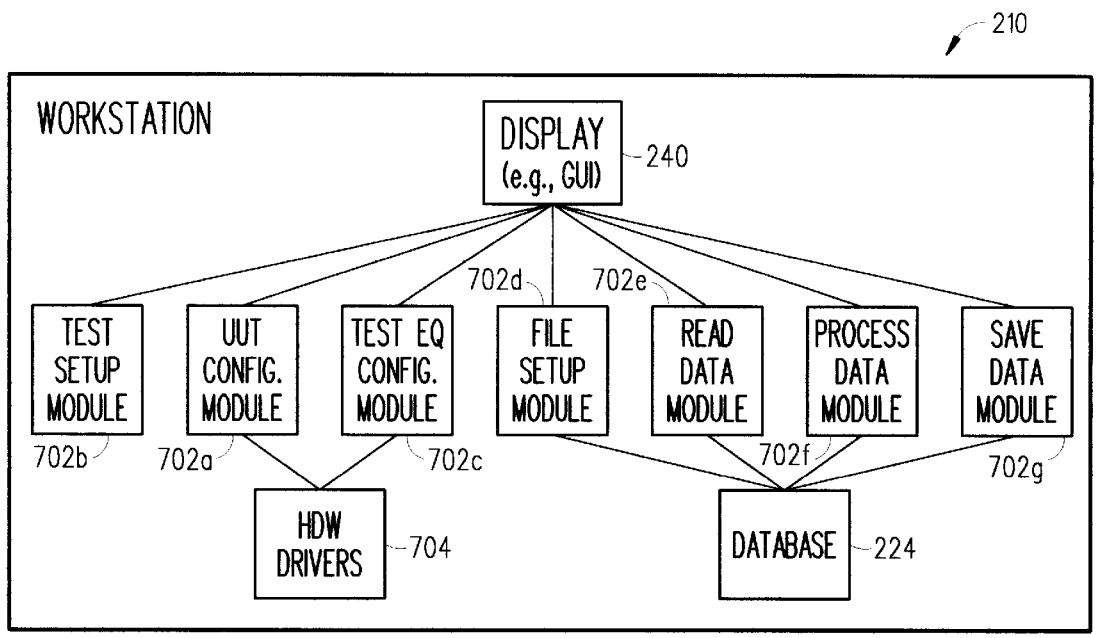
FIG. 7 is a block diagram illustrating, in greater detail the different types of program modules within the work station that can be used to characterize the new product in accordance with the present invention.

Referring to FIG. 7, there is a block diagram illustrating in greater detail the different types of program modules within the work station 210 that can be used to characterize a product. As illustrated, the work station 210 includes a variety of program modules 702a through 702g that make-up the method 300 (Characterization Automation Program (CAP)) used to characterize the product 202. In particular, the work station 210 has a graphical user interface (GUI) 240 through which a user can interact with a UUT configuration module 702a to indicate the type of product that is to be tested. For instance, the product can be an electrical interface board or an optical interface. board both of which can be incorporated into a cross-connect switch.

The user can interact with a test setup module 704b to select the particular test to be conducted on the selected product 202. Typically, the user can select a DC test, an optical test or an electrical test to be conducted on the product 202. Of course, the test setup module 702b can make different test selections available to the user depending on the particular product 202 to be tested. For instance, if the selected product 202 is an electrical interface card then the test setup module 702b could be programmed to let the user select between a DC test and an electrical test.

The user can also interact with a test equipment configuration module 702c to select and configure the different pieces of test equipment 220 that are going to be used to test the product 202. Again, the work station 210 can interface with and control the different pieces of test equipment 220 using the General Purpose Interface Bus (GPIB) 222 (see FIG. 2). Both the test equipment configuration module 702c and the UUT configuration module 702a interact with a hardware module 704 which contains the driver software that enables the work station 210 to communicate with the product 202 and the different pieces of test equipment 220.

In addition, the user can interact with a file setup module 702d to indicate the files/folders in the database 224 in which the work station 210 is to store the data obtained during the test. For instance, the user can provide a name for the particular test and also indicate a path to the data files in the database 224. The user can even use previously named files/folders used in a past test to help setup a new test that is similar to the past test.

Lastly, the user can also interact with a read data module 702e, a process data module 702f and a save data module 702g to help organize and analyze the data obtained during the testing of the product 202. As illustrated, the file setup module 702d, the read data module 702e, the process data module 702f and the save data module 702g are all connected to the database 224. Preferably, the work station 210 uses a graphical programming language such as LabVIEW® to analyze the test data and generate the statistical model which predicts the permissibility of making like products that can be provided to a manufacturer who can then use the statistical model to effectively mass-produce these products.

From the foregoing it should be understood that the system has the capability to automate the characterization process of a product so as to require minimal interaction (if any) from a user which is a marked improvement over the state-of-the-art that required a great deal of manual interaction from a user and as such was prone to errors. This automation of the characterization process by the system effectively reduces the time needed to test a new product and the time needed to generate a statistical model indicating the permissibility of like products.

Below is a detailed description of the different aspects of the Characterization Automation Program (CAP) used by the system 200, work station 210 and method 300 to characterize a product 202. Also provided below is a description about an exemplary optical console and how the present invention can be used to characterize an exemplary optical interface card.

CHARACTERIZATION AUTOMATION PROGRAM (CAP)

1 GENERAL
   1.1 Purpose
2 REQUIREMENTS
   2.1 Graphical User Interface
      2.1.1 User Selections
      2.1.2 Status
      2.1.3 User Actions/Notifications
   2.2 Taguchi Matrix Generation
   2.3 Extensibility
   2.4 Equipment Substitution
      2.4.1 Standard Test Equipment
      2.4.2 Substitute Equipment
   2.5 Standardization
   2.6 Control Interface
   2.7 Process Flow Control
   2.8 Data Analysis
3 FILE SYSTEM
   3.1 Naming Conventions
      3.1.1 Prefix
      3.1.2 Major
      3.1.3 Minor
      3.1.4 Extra
   3.2 File Name Extensions
      3.2.1 Data File (.prn)
      3.2.2 Configuration File (.cfg)
      3.2.3 Standard File (.std)
      3.2.4 Information File (.inf)
      3.2.5 Special File (.spc)
      3.2.6 Error File (.err)
      3.2.7 DataBase File (.db)
      3.2.8 Project File (.prj)
   3.3 File Formats
      3.3.1 Data File (.prn)
      3.3.2 Configuration File (.cfg)
      3.3.3 Standard File (.std)
      3.3.4 Information File (.inf)
      3.3.5 Special File (.spc)
      3.3.6 Error File (.err)
      3.3.7 Database File (.db)
      3.3.8 Project File (.prj)
   3.4 File Directory
      3.4.1 Standard File Storage
      3.4.2 Data File Storage
      3.4.3 Operation File Storage
4 INSTRUMENT DRIVERS
   4.1 Organization
      4.1.1 Library (.11b)
      4.1.2 VI (.vi)
      4.1.3 Location
   4.2 Interface
   4.3 Development Procedure
   4.4 Standard Connector Pane
5 VI STANDARDS
   5.1 Organization
      5.1.1 Library (.11b)
      5.1.2 VI (.vi)
      5.1.3 Defined Field Names
      5.1.4 Directory
   5.2 Front Panel (FP)
      5.2.1 Documentation
      5.2.2 Cosmetics
      5.2.3 General
   5.3 Connector Pane
      5.3.1 Number of Connectors
      5.3.2 Inputs and Outputs
      5.3.3 ICON
   5.4 Diagram
      5.4.1 Documentation
      5.4.2 Layout
   5.5 General Objectives 6 THEORY OF OPERATION
  6.1 General
    6.1.1 Configuration
    6.1.2 Collection
    6.1.3 Control
  6.2. Graphical User Interface
    6.2.1 Main Window
    6.2.2 Status Window
    6.2.3 Option Windows
    6.2.4 Data Window

LIST OF ABBREVIATIONS

| | |
|---|---|
| ASIC | Application Specific Integrated Circuit |
| BER | Bit Error Ratio, which is dimensionless |
| CCTS | Cross-Connect Test Software |
| DS3 | 44.736 Mbit/s, AMI formatted electrical signal |
| STS1 | 51.84 Mbit/s, AMI formatted electrical signal |
| OC3 | Optical Carrier level 3 (155.52 Mbit/s) |
| OC12 | Optical Carrier level 12 (622.08 Mbit/s) |
| LOS | Loss of Signal |
| LBO | Line Build Out |
| N/A | not applicable |
| VI | Virtual Instrument |
| LabVIEW | Laboratory Virtual Instrument Engineering Workbench |
| GPIB | General Purpose Interface Bus |
| bps | bits per second, units used to express rates of data signals |
| Hz | hertz, units used to express the rates of clock and analog signals |
| A | Amperes |
| V | Volts |
| b | bit |
| B | byte |
| k | kilo, 1000 |
| K | binary kilo, 1024 |
| dB | decibel, a logarithmic ratio |
| dBm | decibel referenced to 1 mW, which is used to express power |
| dBV | decibel referenced to 1 V, which is used to express voltages |
| s | seconds |
| S | siemens |
| i.e. | Latin abbreviation for "that is" |
| e.g. | Latin abbreviation for "for example" |

1. GENERAL

1.1 Purpose

Preferably the Characterization Automation Program (CAP) uses the LabVIEW (LV) programming environment to automate the process of characterizing a new product (e.g., circuit boards used in a cross-connect switch). The traditional characterization includes the manual steps of setting the environmental conditions (temperature, voltage, etc.), configuring the UUT, configuring the test equipment, collecting the test data and analyzing the test data. The CAP effectively automates all of these procedures so as to increase throughput and reduce the introduction of errors. Basically, a user interacts with a graphical user interface (GUI) and follows the setup process to input all of the required parameters. After completion of this step the CAP continues the test process with minimal user interaction. After all tests have been completed the data is analyzed by the work station to generate a statistical model that indicates the possibility of like products.

2 REQUIREMENTS

2.1 Graphical User Interface

LabVIEW (LV) is a graphical programming environment that can be used to create windows (Front Panels) for user interaction. These panels present the user with a series of selections appropriate to the operation of the CAP. The entire operation of the CAP can be controlled through these panels.

2.1.1 User Selections

All user selections can be limited to the Front Panels (FP) Each selection that is made effectively narrows the scope of subsequent selections. It should not be possible for the user to make an invalid selection.

Example: The user selects an electrical I/O module. Since optical power measurements can not be performed on this module, that test will not be presented as an option.

2.1.2 Status

The user can be presented with information on the current state of the CAP. This may include such items as: Setup Mode or Testing Mode, the module under test, the current test in progress, etc. A secondary function can be to present the user with the data that has been previously collected. This can serve to verify that the test and/or module product is operating properly.

2.1.3 User Actions/Notifications

A goal of the present invention is to have completely automated testing. However, due to some types of testing this is not always possible. In the case that the user is required to attend the test, some indication will be provided to the user before the test is selected. In this manner the user may decide to separately execute the attended tests and then execute the automated tests. At the point in attest that user action is required, the GUI can inform the user of the type of action required.

2.2 Taguchi Matrix Generation

The CAP allows the user to generate an orthogonal array using some standard variables. The CAP also has the capability to generate names and values for the variables. A typical Taguchi Matrix can be limited to an L9 array (4 variables, 3 levels, 9 total tests). However, the Taguchi Matrix can have a variety of array sizes. The user can generate an array from a standard template or use an existing array.

2.3 Extensibility

The CAP is defined in a manner that allows for the addition of new tests, modules, and equipment without having to rewrite major portions of the code. In order to accomplish this a database type structure can be employed. This structure incorporates all of the current information and has the ability to add and/or update information.

2.4 Equipment Substitution

2.4.1 Standard Test Equipment

Test consoles consisting of the test equipment required to perform specific tests can be developed. These test consoles can be delineated along the lines of the type of test performed. Generic consoles could be Optical, Electrical, and DC. Provisions can be made in the CAP for any ancillary test equipment that is required for a particular test.

A list of standard test equipment and related information can be found in Table A.

2.4.2 Substitute Equipment

Although the preferred method uses test consoles, it is possible for the user to collect the proper type of equipment without using the test consoles. Due to limited availability of certain types of test equipment, provisions can be made that would allow the user to substitute other equipment that performs the same function. This functionality can be provided through a translation table mechanism.

2.5 Standardization

In order to ease integration and allow for updates it is possible to set specific standards for data collections and storage, instrument drivers and GPIB address, and VI operations. Each of these standards are described in detail below.

2.6 Control Interface

A possible standard Unit Under Test (UUT) control interface will be CCTS (Cross-Connect Test Software). This can be provided as VIs that use the CCTS interface to control the UUT, shelves, etc. A provision to use other interfaces (YACK, BLAB, etc.) can be included in the system.

2.7 Process Flow Control

A user is able to control the flow of the process in order to start, stop, and pause testing. Errors can be handled by the CAP in a graceful manner. For example, unexpected interruptions would not cause erratic behavior or loss of data.

2.8 Data Analysis

The data can be formatted in such a way as to allow the user to run Cpk (the analyzing step 306) using a MathCad application (for example). This may be started from the CAP or external to it.

3 FILE SYSTEM

The files contain data collected during testing, test configurations, etc.

3.1 Naming Conventions

The files can be stored in the UNIX environment (or any other environment) and therefore can have a maximum of 255 characters in the filename. The files are typically given a descriptive name that implies what the file contains. The filename can consist of the following generic types separated by the underscore character. All characters are typically alphanumeric. No special characters (except the underscore) are allowed in the UNIX environment. Mixed upper and lower case are allowed in the UNIX environment. A normal convention can be to capitalize the initial letter in a word, most acronyms are entirely in uppercase. The following format can be used for naming files.

a) Prefix—Required
b) Major—Required
c) Minor—Conditional
d) Extra—Optional
   e.g. Prefix_Major_Minor_Extra

3.1.1 Prefix

The prefix typically describes the system/module/equipment that the file is related to. This field is required on all filenames. If this file is related to a module, the mnemonic of the module can be the prefix.

e.g. OXB201 would contain information that relates to the OXB201 module.

3.1.2 Major

The major field typically describes the class of information that is contained in the file. This field is required on all filenames.

e.g. P5V would contain information that relates to the positive five volts.
P5V—Positive 5 Volt data
N5V—Negative 5 Volt data
P3V—Positive 3.3 Volt data
N48—Negative 48 Volt data
DS3—DS3 type data
E1—E1 type data
DS1—DS1 type data

3.1.3 Minor

The minor field typically describes the subclass of information that is contained in the file. This field is conditionally required on all filenames. If there is more than one subclass this field is required.

e.g. EP3_DS3_Freq would contain information that relates to the frequency of the DS3 on an EP3 module.

3.1.4 Extra

The extra field typically describes any additional information that is necessary to make the file unique. This field is optional on all filenames. A user can use as many additional extra fields (separated by an underscore) as necessary to uniquely identify the file.

e.g. TransID would contain information that relates to the particular mode of operation.

Example: EP3101_P5V_Current_TransID—This file contains information on the positive five volt current of the EP3101 in TransID mode.

3.2 File Name Extensions

The extension of the filename can indicate the type of information stored in the file. The extension often includes a period (.) followed by a three letter (lowercase) designation from the following:

3.2.1 Data File (.prn)

For backwards compatibility with other tools (e.g. MathCad) the data files can have an extension of .prn.

Data files contain the data collected from the test efforts. This data may come from any source, such as test equipment or ASIC registers on the module.

3.2.2 Configuration File (.cfg)

Configuration files can hold various types of information, including information on other files and test setups. If the file is related to another file it can have the same name. The extension of the referenced file a typically placed in the extra field of the configuration file. (e.g. EP3101_P5V_Current_TransID_prn.cfg holds information on the EP3101_P5V_Current_TransID.prn file). These files can be in the format that is compatible with LV5.x configuration files. The configuration files have an extension of .cfg.

3.2.3 Standard File (.std)

These files can hold template information for the generation of the other file types. These files have generic file names and can also have the same format as the file to be generated. The extension for standard files is .std.

3.2.4 Information File,(.inf)

These files can hold general information. This includes (but not limited to) module setups, temporary files, and notes. The extension for information files is .inf. These files may be read by LV or may be human viewable (or both).

3.2.5 Special File (.spc)

These files can hold information that is not covered by the above file types. The extension for special files is .spc.

3.2.6 Error File (.err)

These files can hold error information returned from VIs, modules, test equipment, etc. The extension for error files is .err.

3.2.7 DataBase File (.db)

These files contain the core functionality of the CAP. Unlike the previous files, these are generated prior to the operation of the CAP. A separate program can be used to maintain these files and should only be run to update/add information. The extension for database files is .db. These files can be stored in Labview native format and are not generally human readable. As a sanity check these files can be used to generate check files to verify their contents.

3.2.8 Project File (.prj)

These files contain the user selections and path information of the test scenario. These files are often generated during the operation of the CAP. The extension for project files is .prj. These files may be saved and reused to create new files, or to setup the CAP for additional testing based on previous testing. The format of these files is typically the LV 5.x configuration file format.

3.3 File Formats

The files store information in the defined type, in order to allow VIs to be written to handle each type.

3.3.1 Data File (.prn)

Data files should generally contain only one column of information (preceded with a column of ones (1)). The column of ones (1) is required by MathCad, and is maintained to provide backward compatibility. The data files can be formatted to be compatible with the Read From Spreadsheet File and Write To Spreadsheet File VIs that are supplied by the LV program (File I/O library). The format of the data files are tab delimited (between columns) and has an EOL character at the end of the row (between rows). The data is written to the data file as strings.

3.3.2 Configuration File (.cfg)

Configuration files can have a format compatible with the Configuration File VIs provided by LV. These files include a block followed by key numbers.

Example
[DataType]—Block Name
Key=Double—Key number one specifies type double.

3.3.3 Standard File (.std)

Standard files can be formatted the same as the file they are intended to generate.

3.3.4 Information File (.inf)

Information files can be formatted for the type of data that they contain.

N.B. The related configuration file can hold the data type of the file.

3.3.5 Special File (.spc)

Special files are free format files.

3.3.6 Error File (.err)

Special files are free format. Generally they hold strings (ASCII) data types.

3.3.7 Database File (.db)

Database files are in the LabVIEW native format.

3.3.8 Project File (.prj)

Project files conform to the LabVIEW configuration file format.

3.4 File Directory

Preferably there are three distinct types of files that are operated on by the CAP. These are, standard files, data files, and operational files. The following describes the location for these file types.

3.4.1 Standard File Storage

These files hold information that is important to the operation of the CAP. The file extensions include (but not limited to) .std, and .db.

These files are stored in the location /apps/NI/labview/user.lib/apps/CAP/files.

3.4.2 Data File Storage

These files contain the data that is collected as part of the function of the CAP. The file extensions include (but not limited to) prn, .cfg, and .inf.

These files are stored in user definable location. Typically this will be a sub directory of the users home directory.

3.4.3 Operation File Storage

These files contain the information regarding the current instance of the CAP. These files are generated in response to user selections. The file extensions include (but not limited to) prn, .cfg, and .inf.

These files must are stored in a predefined location so that the CAP can always have access to them. This location is a subdirectory of the users home directory. It can be a hidden directory named.cap_project e.g. /homes/kentkb/.cap_project

4 INSTRUMENT DRIVERS

Instrument Drivers (ID) are VIs that configure and operate test equipment. The interface to the test equipment is generally GPIB, but can be serial, VXI, etc. The following outlines the standards that govern ID development.

4.1 Organization

4.1.1 Library (.11b)

A library is a collection of VIs that are intended to operate on the same object. The library typically contains all of the VIs that are directly accessible to the user (programmer). The library can have a name of the following format—Prefix.11b. The prefix is limited to eight (8) characters for maximum transportability across platforms. Platform specific special characters (e.g. '/') are not typically allowed. The prefix should describe the object that the library operates (e.g. HP3488A).

4.1.2 VI (.vi)

A VI is the smallest functional unit in Labview. VIs stored in libraries (.11b) may have up to 255 characters in the name (including the vi extension). No special characters other than the underscore ('_') are generally allowed. The VIs can be written with the use of Sub-VIs in mind. The VI names shall have the following convention:

Prefix_Major_Minor(...).vi—Prefix shall be the same as the prefix of the library. Major is the major class of the VI (e.g. Get, Set, Read). Minor is the detailed function of the major class (e.g. Settings, Channel, etc.). More fields can be added after the minor field to provide more resolution of the specific operation of the VI.

4.1.3 Location

All libraries can be stored in a standard location. This ensures that the VIs are accessible and that updated drivers are globally available. There are several possible levels of the hierarchy as described below:

LabVIEW—The executable may reside anywhere. It will be referenced herein only as $LVHOME.

User Library—This is the same for all installations and is $LVHOME/user.lib.

Test Equipment—All libraries related to test equipment are below the following:$LVHOME/user.lib/testgear.

Equipment Type—Each functional type of test equipment is stored in separate locations as follows Logic Analyzers, Network Analyzers, etc. are stored in Attenuators are stored in $LVHOME/user.lib/testgear/Attenuators Pulse and Waveform generators, etc. are stored in Multimeters are stored in $LVHOME/user.lib/testgear/Multimeters Power Supplies are stored in $LVHOME/user.lib/testgear/Powersupply Oscilloscopes are stored in $LVHOME/user.lib/testgear/Scopes Switch Boxes are stored in $LVHOME/user.lib/testgear/Switches Equipment that generate and receive specific types of signals are termed test sets these are stored in $LVHOME/user.lib/testgear/TestSets Specific Equipment—Each unique piece of test equipment is stored in a separate location below it's type. The name typically reflects the number of the equipment and also reflects it's library name.

4.2 Interface

All new drivers in the preferred embodiment of the present invention are required to use the VISA interface. If an existing driver is updated for some reason it should be converted to the VISA standard. For information concerning VISA refer to National Instruments AN111.

4.3 Development Procedure

The instrument driver can be developed in accordance with LabVIEW Development Coding Guidelines and National Instruments AN006. Refer to the next section for details on general VI development.

In particular, the VIs can be developed in successive layers. The smallest layer would be related to the smallest function that can be performed in the instrument (i.e. a single button push on the instrument). Combinations of these kernel VIs can be used in larger VIs to perform a function. Combinations of functions would be used to perform a test.

Example—The test could be to measure the pulse width of a waveform on an oscilloscope. This would be composed of two functions 1) setup the measurement and 2) retrieve the measurement.

The function to setup the measurement may be composed of several kernels: 1) Set vertical scale, 2) set horizontal scale, and 3) set trigger level. The retrieve function may contain such kernels as: 1) set channel, 2) set measurement type, and 3) retrieve data.

4.4. Standard Connector Pane

Figure 8:
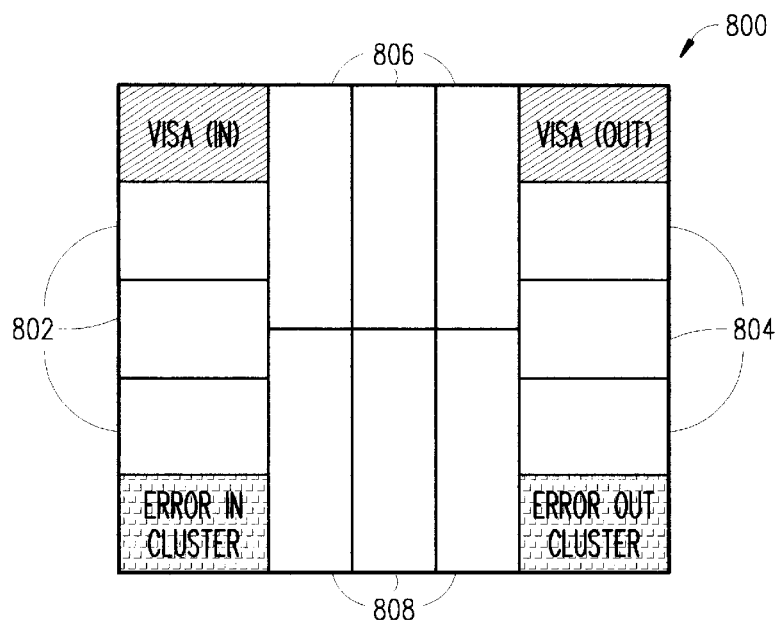
FIG. 8 is a diagram of. Ea generic instrument driver connect pane that can be used in the work station.

The standard connector pane 800 can be based on the one depicted in FIG. 8. The extreme left connections 802 are for inputs while the extreme right connections 804 are for outputs. The top middle and bottom middle connections 806 and 808, respectively, are generally for inputs and outputs. These can be used in either capacity if necessary. The four corners are predefined as shown.

5 VI STANDARDS

This section describes preferable standards that can be used to generate VIs.

5.1 Organization 5.1.1 Library (.11b)

A library is a collection of VIs that are intended to operate on the same object. The library typically contains all of the VIs that are directly accessible to the user (programmer). The library can have a name with the following format—Prefix.11b. The prefix is limited to eight (8) characters for maximum transportability across platforms. Platform specific special characters (e.g. '/') are generally not allowed. The prefix should describe the object that the library operates (e.g. HP3488A or Files).

During the development process, the VIs can be controlled using the Source Code Control (SCC) provided in the LabVIEW Professional Edition. After the development is completed, these VIs are stored in libraries in the standard location.

5.1.2 VI (.vi)

A VI is the smallest functional unit in LabVIEW. VIs stored in libraries (.11b) may have up to 255 characters in the name (including the .vi extension). No special characters other than the underscore ('_') are allowed. The VIs can be written with the use of Sub—VIs in mind. The VI names can have the following convention: Prefix_Major_Minor(...).

vi—Prefix shall be the same as the prefix of the library. Major is the major class of the VI (e.g. Get, Set, Read). Minor is the detailed function of the major class (e.g. Settings, Channel, etc.). More fields can be added after the minor field to provide more resolution of the specific operation of the VI.

5.1.3 Defined Field Names

The following is a list of the pre-defined field names. Functions that do not fit into the pre-defined categories can be added at the users discretion. The initial character can be uppercase, all other characters can be lowercase. [2]

Get/Set—Used to read (Get) and write (Set) data to/from any object (instrument, module, etc.) EXCEPT files.

Read/Write—Used to read and write data to/from files ONLY.

Config—Used to write configuration data to an object.

Init—Used to initialize an object.

5.1.4 Directory

When a VI or library has been accepted it can be placed in the User library. The directory structure is defined in structure of the document LabVIEW Library Structure.

5.2 Front Panel (FP)

5.2.1 Documentation

All front panel objects can have their function defined in the description field. And the VI can be described in the area provided by LV.

5.2.2 Cosmetics

The use of colors can be limited. The background of the Front Panel can be the medium grey color. Labels (for controls, indicators) can have a transparent background. Important controls, indicators can use the System Font. Typically inputs are to the left of the FP and outputs are to the right of the FP. Fonts can be limited to Application Font, System Font, and Dialog Font.

5.2.3 General

Preferably, objects not designed to be controlled by the user are hidden. The front panel can be sized to show only the necessary objects. The name of a control can contain the default state.

5.3 Connector Pane 5.3.1 Number of Connectors

A number of connectors can be reserved for future growth. Inputs that are required for the VIs operation can be designated as Required using the method provided by LV. The preferable connector pane is the one that contains 5 small terminals to the left and right and 2 rows of 3 in the middle. (Refer to FIG. 8).

5.3.2 Inputs and Outputs

The inputs can be wired to the left and bottom connectors. The outputs shall be wired to the right and top connectors. The top left and right connectors are for the primary input and output (the output is a duplicate of the input.) The bottom left and right connectors are reserved for Error In and Error Out objects. (Refer to FIG. 8).

5.3.3 ICON

An icon can be defined for each of the three color options (B&W, 16, & 256 Color). Icons for a group of related VIs can have similar icons. Icons from the examples should be used as a starting point.

5.4 Diagram

5.4.1 Documentation

All constants on the block diagram can have a description. All structures (loops, cases, sequences) can have a free label to describe their function. All sequence locals can be labeled.

5.4.2 Layout

Sequences can be avoided where possible. Instead, data flow is used to control the sequence of operation. The layout of the program flow is generally from left to right.

5.5 General Objectives

Pop up VIs and dialog boxes are kept to a minimum.

Pop up VIs and dialog boxes are set so that no borders and no menu or tool bars are visible.

Non time critical VIs with loops can have a Wait Ms timer function.

SubVIs can have the appropriate execution options set.

Controls that have a defined default can be saved with the default value.

Version control can be enabled for every VI.

The name of the VI developer can be included in the VI info dialog.

THEORY OF OPERATION

This section describes the theory of operation of the Characterization Automation Program (CAP).

6.1 General

The CAP can be described as performing the following functions: Configuration, Collection, and Control. Each of these functions can be further subdivided based on the object it manipulates.

6.1.1 Configuration

The CAP is used to configure different aspects of the test process. Items that can be configured are: Modules (products), Experiments, Tests, and Consoles (test equipment). While each of these items have common properties, they are manipulated in different fashions.

6.1.1.1 Modules (PRODUCTS)

Module information that can be configured is: Module type, # of modules to test, control interface to use, and modes of operation.

6.1.1.2 Experiments

Experiments are defined by the Taguchi Matrix. The items of interest are the Variable names, and the values that the variables can achieve.

6.1.1.3 Tests

Tests are the types of operations that can be performed on the modules. These are dependent upon the type of module selected.

6.1.1.4 Consoles

The consoles are collections of test equipment. The consoles can be configured to perform a variety of tests, dependent upon the test equipment that is installed.

6.1.2 Collection

Collection can be defined as the end result of the testing. This can take various forms dependent upon the type of testing being done. The results could be a simple pass/fail, a single value, or an entire series of values. As a function of collection the data is gathered, stored and evaluated.

6.1.3 Control

A main objective of the CAP is to control all of the aspects of testing and to provide a coherent structure. This is accomplished by defining allowable operations and designing known locations and features.

6.2 Graphical User Interface

Figure 9:
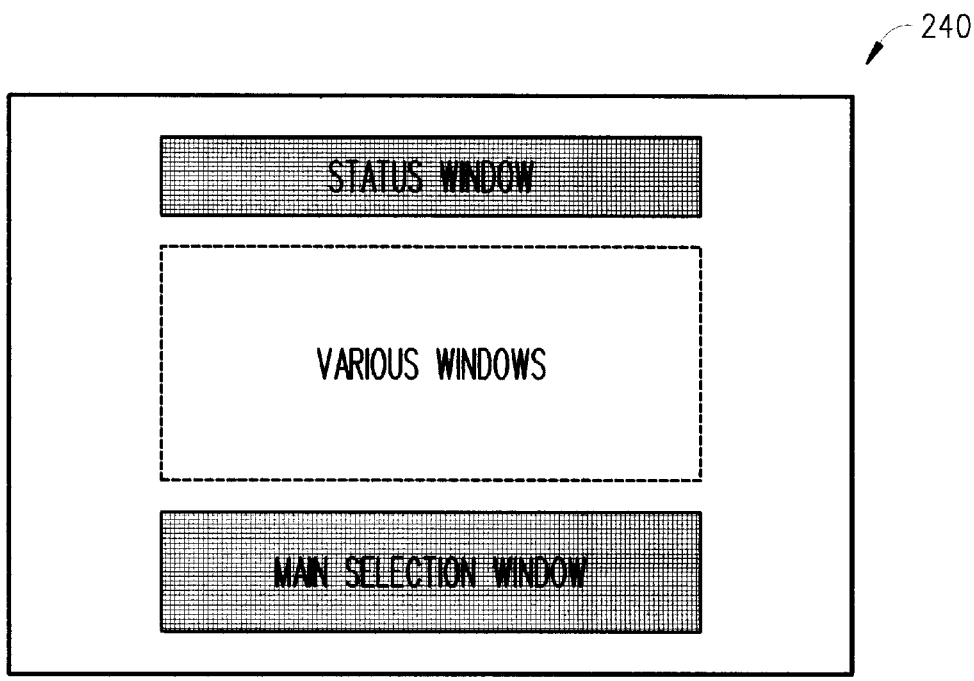
FIG. 9 is a display of a graphical user interface (GUY) that can be used in the work station.
Figure 10:
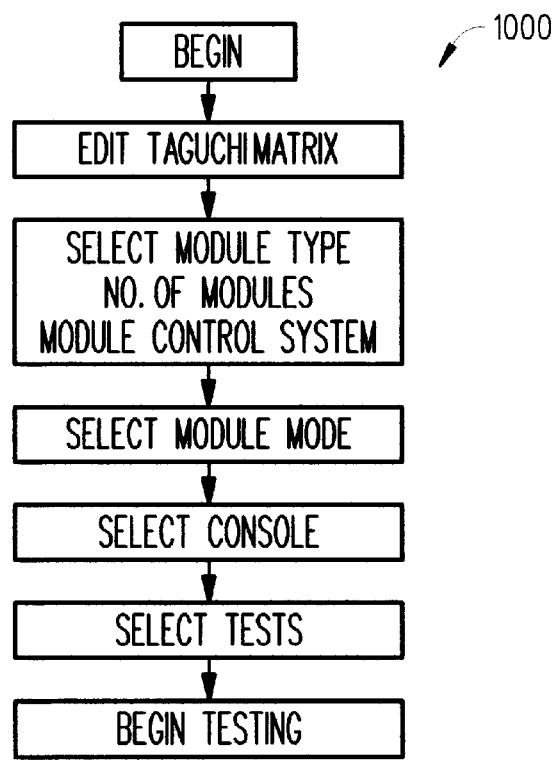
FIG. 10 is a flowchart illustrating in greater detail the operations of the testing step of the preferred method of FIG. 3 (compare to FIG. 4)

Referring to FIG. 9, there is a diagram of a GUI 240 which is the main focus of the users interaction with the CAP. Due to the large amount of information that is involved, the user is presented with only a small section at any time. Subsequent sections can present valid options for selections made in previous sections. In order to add/update information required by the CAP, external databases can be created and maintained. The GUI can have two main windows open at all times. The main selection window defines the available activities and the status window shows the current status of setup/testing. As the need arises (due to user selection or test activities) other windows appear. In the case of user setup windows, some user action is required before the window can close and the CAP will accept new commands. Other windows may or may not require user interaction.

6.2.1 Main Window

The main window typically contains all of the valid operations that can be performed by the user. These selections often take the form of labeled button selections. Each selection is designed to guide the user through the entire process of setup and execution of a particular type of test. From initial startup the user should select each option in sequence to set each of the parameters required to operate the CAP. As each selection is made an additional window appears. Each window presents only a small portion of the options available. The user is required to make a selection and then accept the current selections. Once accepted these selections are stored for further processing and the window closes. Up until the user elects to begin testing, all previous selections are available for changes. Once testing begins and until it's completion, all setup selections are unavailable. Two additional buttons can be provided to control the CAP itself. One button (Stop) effectively ends the execution of the CAP and returns the user to the Labview environment. This button is only available if no other operation is in progress. A second button (Quit) is always available. Selecting this button completely exits the CAP, any current operations are aborted and the program exits. FIG. 10A illustrates a general flow of a setup process 1000 that is another way of representing the testing step 302 of FIG. 4.

6.2.2 Status Window

The status window can be continually updated as the user makes selections. The status window also reflects the current state of testing once it has begun. Typical items displayed include, name of the module, test in progress, number of the current module under test, etc.

6.2.3 Option Windows

As the user makes selections, a window can appear to provide the options. These selections provide the user with options as: setup of Taguchi Matrix, module type, control system, number of modules to test, test console to use, and tests to execute (for example).

6.2.4 Data Window

During the testing the user can select to view the data that has been collected to date. This will allow the user to determine that the testing is progressing properly. A later release may allow the user to stop and restart the test if it is determined that the testing is not working properly.

TABLE A

| Address | Instrument | Type | Generic Name |
|---|---|---|---|
| 0 | Controller Card | GPIB Controller | CIC |
| 1 | | | US1 |

TABLE A-continued

| Address | Instrument | Type | Generic Name |
|---------|-----------|------|--------------|
| 2 | HP6031A | System Power Supply | PS1 |
| 3 | HP6031A | System Power Supply | PS2 |
| 4 | HP6032A | System Power Supply | PS3 |
| 5 | HP6033A | System Power Supply | PS4 |
| 6 | HP3488A | Switch Box | SW1 |
| 7 | HP3488A | Switch Box | SW2 |
| 8 | HP3488A | Switch Box | SW3 |
| 9 | HP3488A | Switch Box | SW4 |
| 10 | MLST103TX | Sonet Transmitter | TX1 |
| 11 | MLST103RX | Sonet Receiver | RX1 |
| 12 | MLST103TX | Sonet Transmitter | TX2 |
| 13 | MLST103RX | Sonet Receiver | RX2 |
| 14 | Thermotron Chamber | Temp Chamber | TC1 |
| 15 | HP8157A/W8200 | Optical/Elect Atten | OA1/EA1 |
| 16 | HP8153A/ HP3457A | Optical/Elect Meter | OM1/EM1 |
| 17 | HP8157A/W8200 | Optical/Elect Atten | OA2/EA2 |
| 18 | HP8153A/ HP3478A | Optical/Elect Meter | OM2/EM2 |
| 19 | JDSFitel | Optical Switch | OS1 |
| 20 | HP3497A | Data Acq. Unit | DAQ |
| 21 | FL6070A | RF Generator | RF1 |
| 22 | FL6080A | RF Generator | RF2 |
| 23 | MLST104B/ CTS710/ HP156MTS | Sonet Transceiver | TR1 |
| 24 | HP37704A/CTS710 /HP156MTS | Sonet Transceiver | TR2 |
| 25 | | | |
| 26 | | | |
| 27 | HP3335A | Signal Generator | SG1 |
| 28 | HP3336B | Signal Generator | SG2 |
| 29 | HP3334A | Counter | CT1 |
| 30 | | | US3 |

FUNCTIONALITY AND OPERATION OF AN EXEMPLARY OPTICAL CONSOLE'S VI

I. Preface

The section below describes the functionality and operation of an exemplary optical console's VI.

1 GENERAL

1.1 Purpose/Function

A main purpose of the optical virtual instrument (VI) is to allow characterization testing of any module (product) with an optical interface. This VI can be driven using National Instrument's software package "LabVIEW". The items to be controlled by the VI, are a work station 210 with LabVIEW installed, temperature chamber 220, and other instrumentation 220 to perform characterization tests. See FIG. 2 for an illustration of the system 200 that can characterize an exemplary optical interface card.

1.2 Characteristics

The console is required to control instruments that can supply and measure a variety of signals to and from the product 202. The console is able to communicate with the other existing consoles (not shown). Preferably, the test equipment installed into console meets ISO 9000 standards, and IEEE 488 specification. TABLES 1–3 below illustrate some exemplary test requirements, console equipment requirements and console connection requirements.

TABLE 1

Generic VI Configuration

| Mneumonic Code | Part Number | Configuration | Release Date |
|----------------|-------------|---------------|--------------|
| Optical | 8BD002240002 | Optical. vi 8BD002240200 | 980830 |

TABLE 2

Test requirements and specification reference of transmitter section

| | |
|---|---|
| Output Optical Power | GR-253-Core Physical Layer 4.2.4.2 |
| Eye Pattern (diagram) | GR-253-Core Physical Layer 4.2.4.4 |
| Extinct Ratio | GR-253-Core Physical Layer 4.2.4.3 |
| RMS Spectral Width | GR-253-Core Physical Layer 4.2.4.1 |
| Jitter Generation | GR-253-Core SONET Net. Sync 5.6.2.3 |

Test requirements and specification reference of receiver section

| | |
|---|---|
| Receiver Sensitivity | See note** |
| Jitter Transfer | GR-253-Core SONET Net. Sync 5.6.2.1 |
| Jitter Tolerance | GR-253-Core SONET Net. Sync 5.6.2.2 |
| Reflectance of Receiver | GR-253-Core Physical Layer 4.2.5 |
| Input level at LOS (or LPA for Optronics) | GR-253-Core Physical Layer 4.2.5 |

N.B. **Perform Bit-Error-Ratio(BER) curve using worst case transmitter (spectral width, extinction ratio, pulse shape, operating wavelength width).

TABLE 3

Console equipment requirements

| | |
|---|---|
| DC power supply | Module dependent |
| Optical Power meter | OC3, OC12 rates |
| Optical Signal Generator (OC3, OC12, Jitter) | Meet GR-253-Core Physical Layer4 |
| Optical Receiver | Meet GR-253-Core Physical Layer4 |
| Optical attenuator | OC3, OC12 rates |
| Optical switch | OC3, OC12 rates |

TABLE 4

Console connection requirements

| | |
|---|---|
| DC connection with return path | +5.0 V, −5.0 V, +3.3 V +5.6 V −5.1 V, −48.0 v |
| 120 VAC | Console requirements |
| Transmitter fiber | Module dependent |
| Receiver fiber | Module dependent |
| GPIB compatible | IEEE-488 |
| Twisted Pair (TP) | Flexible control linkage |

1.3 Workstation requirements

The work station 202 can be a SPARCstation 2 with 32 MB of main memory, 32 MB of disk swap space, 200 MB free disk space. The work station 202 can also have a GPIB card installed. Preferrably, this card meets the IEEE 488 standard. It should be noted that the VI will not operate properly until all equipment connections are made. This includes all GPIB test equipment and the work station.

2 THEORY OF OPERATION

2.1 Customer interface

The front panel can allow the user to select the tests. Once the test or group of tests are selected the VI exits and starts the characterization process. This process can be ran according to the number of modules selected and type of Taguchi matrix selected by the CAP VI. The final stage of the VI is to run statistical analysis of the accumulate data, and store this in a summary report form statistical report. Of course, the technician or engineer is required to make all necessary connections.

CHARACTERIZATION OF AN EXEMPLARY OPTICAL INTERFACE CARD

Preface

The section below describes a qualification test plan that could be implemented on an optical interface board using the optical console. This section describes only the test to be performed and automated, not the test results.

1 OPTICAL MEASUREMNTS

1.1 Receiver Section
1.1.1 Receiver Sensitivity
  1.1.1.1 Specifications:
  The receiver is probably error free($10e-10$ BER) for any power values between or equal to the minimum and maximum power values listed in TABLE 5.

TABLE 5

Minimum and maximum receive sensitivity

| Signal | Reach | Minimum Power (dBm) | Maximum Power (dBm) |
|---|---|---|---|
| OC-3 | Long | −34 | −10 |
| OC-3 | Intermediate | −28 | −8 |
| OC-3 | Short | −23 | −8 |
| OC-12 | Long | −28 | −8 |
| OC-12 | Intermediate | −28 | −8 |
| OC-12 | Short | −23 | −8 |
| OC-48 | Long | −28 | −9 |
| OC-48 | Intermediate | −18 | 0 |
| OC-48 | Short | −23 | −8 |

Figure 11:
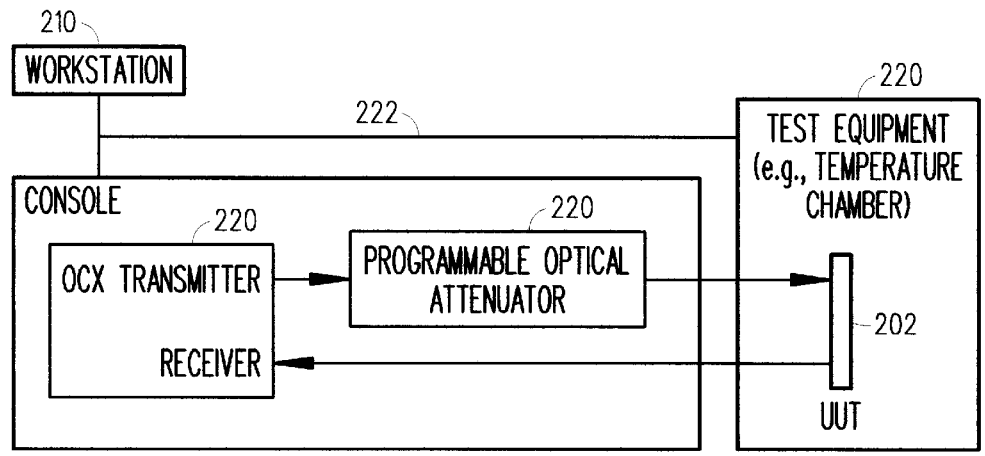
FIG. 11 is a block diagram illustrating a receiver sensitivity test setup that can be used to characterize an optical interface board (e.g., new product)

1.1.1.2 Equipment Requirement: OC-X Logic Generator/Receiver with GPIB interface. Programmable Optical Attenuator.
  1.1.1.3 Test Procedure The attenuation is gradually increased until the receiver starts displaying error. The signal power input to the UUT is then recorded. The receiver sensitivity test setup is illustrated in FIG. 11.
1.1.2 Receiver Overload level
  1.1.2.1 Specifications: The receiver overload point should equal or exceed the value of the maximum power value listed in Table 5.
  1.1.2.2 Equipment Requirement: OCX Transceiver with GPIB interface. Programmable Optical'Attenuator with GPIB interface. Optical Power Meter with GPIB interface.
  1.1.2.3 Test Procedure:
  1) The receiver overload test setup is the same as the receiver sensitivity test setup illustrated in FIG. 11.
  2) Set the optical power to the UUT to −30 dBm by increasing the attenuation value.
  3) Decrease the attenuation until BER=$10e-9$.
  4) The optical power is then measured at the input of the UUT.
1.1.3 Jitter Tolerance
  1.1.3.1 Specifications: Jitter tolerance is the peak-to-peak amplitude of sinusoidal jitter injected in an OC-X signal, that causes a 1 dB power penalty at the receiver. See FIG. 12 for a graph illustrating the jitter tolerance characteristics using an exemplary optical carrier (e.g., OC-12, GR-253).
  1.1.3.2 Equipment Requirement: SONNET Jitter and Analyzer with GPIB interface. SONNET OC-X Transmitter and receiver with GPIB interface.
  1.1.3.3 Test Procedure:
  1) The jitter tolerance test setup is illustrated in FIG. 13.
  2) At each frequency point in FIG. 12, jitter is set to the maximum value.
  3) The Jitter amplitude is decreased until the receiver stops counting errors.
  4) The input jitter amplitude is then recorded.
1.1.4 Reflectance of Receiver
  1.1.4.1 Specifications: See FIG. 14 for a block diagram illustrating an optical LOS alarm test setup that can be used to characterize an optical interface board.
  1.1.4.2 Equipment Requirement:
  1.1.4.3 Test Procedure:
1.1.5 Input level at LOS (or LPA for Optronics)
  1.1.5.1 Specifications:
  Verify the LOS alarm vs. levels of optical input signal.
  1.1.5.2 Equipment Requirement: OCX Transceiver with GPIB interface. Programmable Optical Attenuator. 1.1.5.3 Test Procedure: LOS alarm can be read from the control ASICon board.
  1) Increase the attenuation until LOS alarm occurs.
  2) Record the attenuation level.
  3) Verify it by measuring the optical power at this attenuation level

1.2 Transmitter Section
1.2.1 Output Optical Power
  1.2.1.1 Specifications: The output optical power limits are specified in Table 6.

TABLE 6

Output Optical Power Specifications:

| Signal | Ptmax (dBm) | Ptmin (dBm) |
|---|---|---|
| OC-3 | 0 | −5 |
| OC-12 | +2 | −3 |
| OC-48 | +3 | −2 |

1.2.1.2 Equipment Requirement:
  OC-X Transmitter with GPIB
  Programmable optical power meter with GPIB interface.
  Optical Patch Cable.
  1.2.1.3 Test Procedure:
  1) Supply Power to UUT.

2) Take measurement of optical output power of the transmitter at different supply voltage levels.

Figure 15:
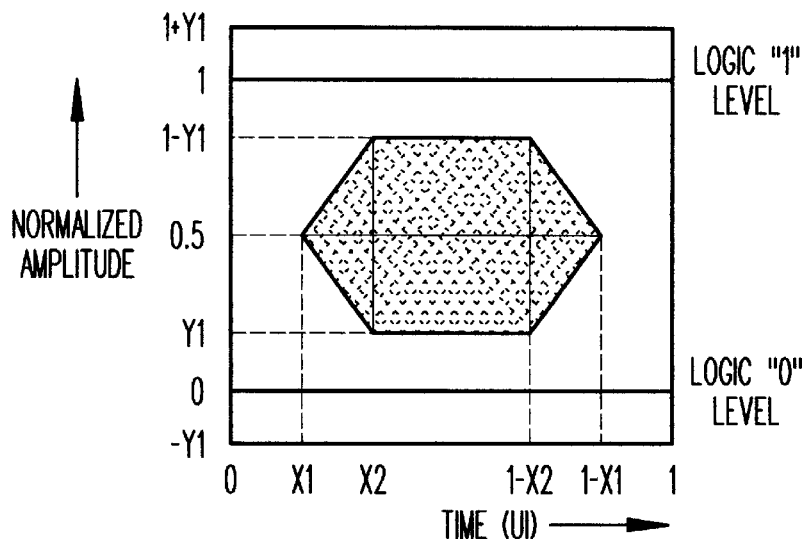
FIG. 15 is a graph illustrating a SONNET eye diagram mask (OC-1 to OC-12)

1.2.2 Eye Pattern (see FIG. 15).

Figure 16:
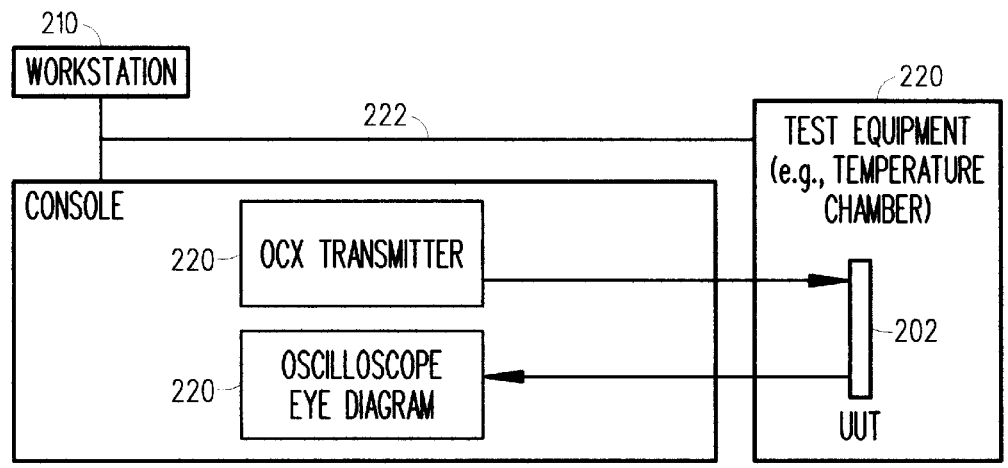
FIG. 16 is a block diagram illustrating a test setup for eye-diagram mask testing that can be used to characterize the optical interface board.

1.2.2.1 Specifications: A main purpose of this test is to meet the eye diagram of OC-X rate signal. FIG. 15 is the SONNET eye diagram mask for OC-1 to OC-12. A test setup for eye-diagram mask testing is illustrated in FIG. 16.

1.2.2.2 Equipment Requirement: OC-X Transmitter with GPIB interface. Sampling oscilloscope with OC-X eye diagram mask feature & GPIB interface.

1.2.2.3 Test Procedure:

1) Supply nominal voltage to UUT.
2) Set temperature.
3) Set oscilloscope for optical eye pattern measurement.
4) Vary the frequency of the OCX test clock as specified in $C_{PK}$ setting.
5) Very the signal to be well within eye diagram mask.

Figure 17:
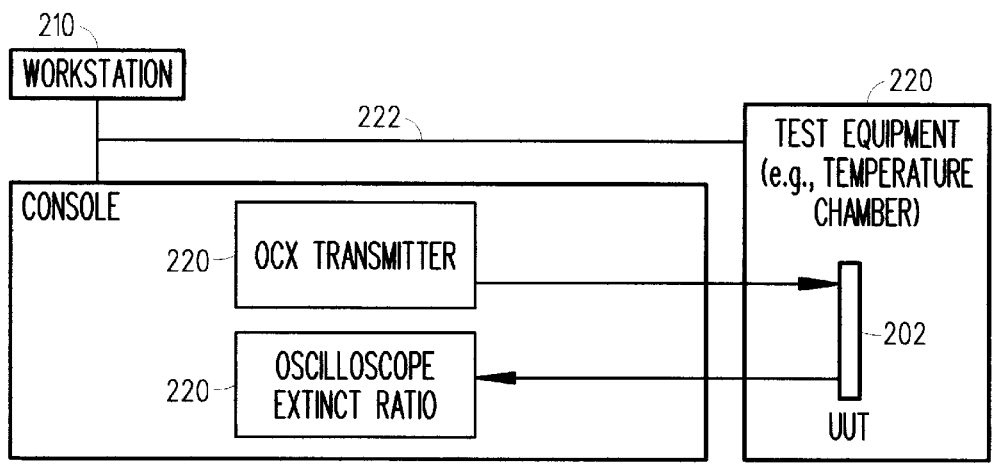
FIG. 17 is a block diagram illustrating a test setup for performing extinct ratio measurements that can be used to characterize the optical interface board.

1.2.3 Extinction Ratio 1.2.3.1 Specifications: The minimum acceptable value of the extinction ratio is 8.2 dB. The test is preferably performed under fully modulated conditions in the presence of worst-case reflections. A test setup for performing extinct ratio measurements is illustrated in FIG. 17.

1.2.3.2 Equipment Requirement:

Sampling oscilloscope with OC-X extinct ratio feature & GPIB interface

OC-X Transmitter with GPIB interface.

1.2.3.3 Test Procedure:

1) Set transmitter to desired OC-X signal.
2) Set oscilloscope to measure extinct ratio.

1.2.4 Jitter Generation 1.2.4.1 Specifications:

A main purpose of this test is to meet a jitter generation standard.

1.2.4.2 Equipment Requirement:

1.2.4.3 Test Procedure:

1.2.5 RMS Spectral Width.

1.2.5.1 Specifications:

1.2.5.2 Equipment Requirement:

SONNET Jitter and Wander Analyzer.

OC-X Transmitter and receiver.

Figure 18:
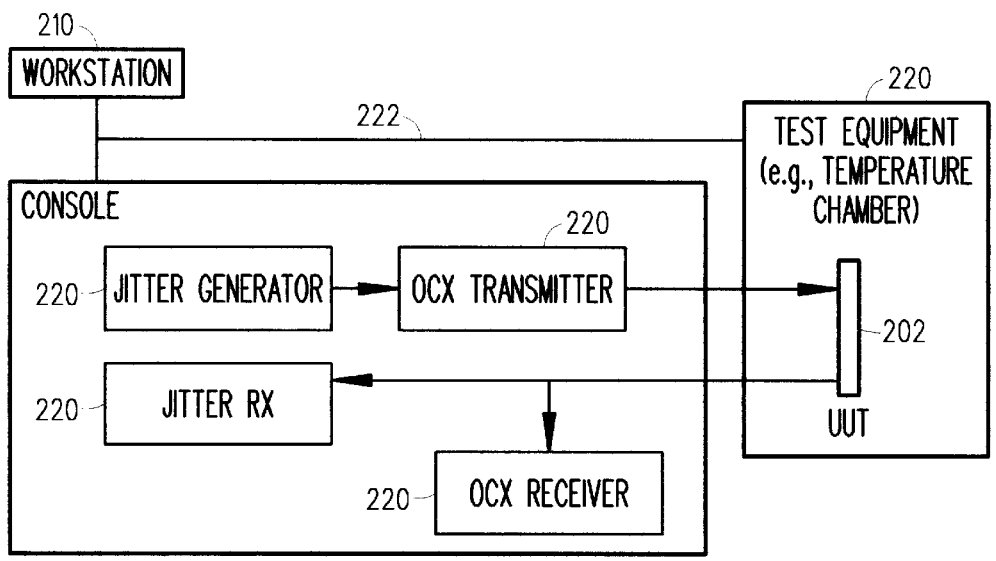
FIG. 18 is a block diagram illustrating a jitter generation test setup that can be used to characterize the optical interface board.

1.2.5.3 Test Procedure:

1) The Jitter Generation test setup is shown in FIG. 18.
2) the Jitter test set should be calibrated to avoid the use of a correction factor.
3) No jitter is injected. The jitter generator should be set to allow an accuracy measurement equal to 0.001 UI rms and an accuracy better than +/−5% +/−0.003 UI rms
4) Record the generated rms jitter value.

1.2.6 Jitter Transfer 1.2.6.1 Specifications: A main purpose of this test is to meet a jitter transfer standard.

1.2.6.2 Equipment Requirement: SJ300 SONNET Jitter and Wander Analyzer. ST103TX & ST103RX; OC-X Transmitter and receiver.

Figure 12:
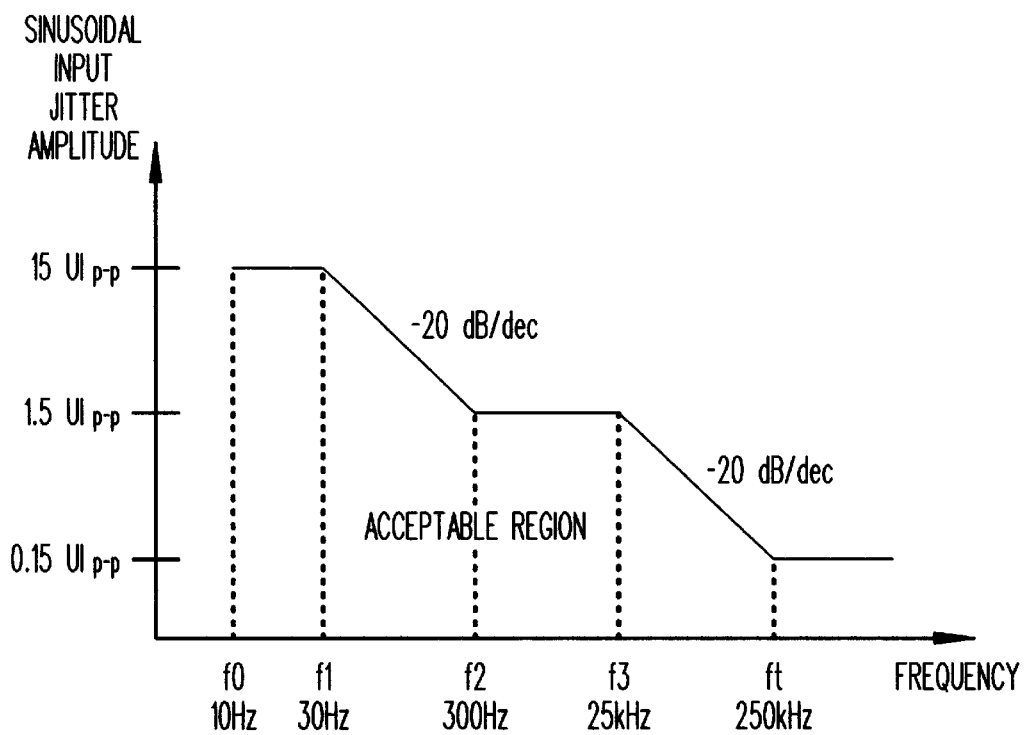
FIG. 12 is a graph illustrating the jitter tolerance characteristics using an exemplary optical carrier.
Figure 13:
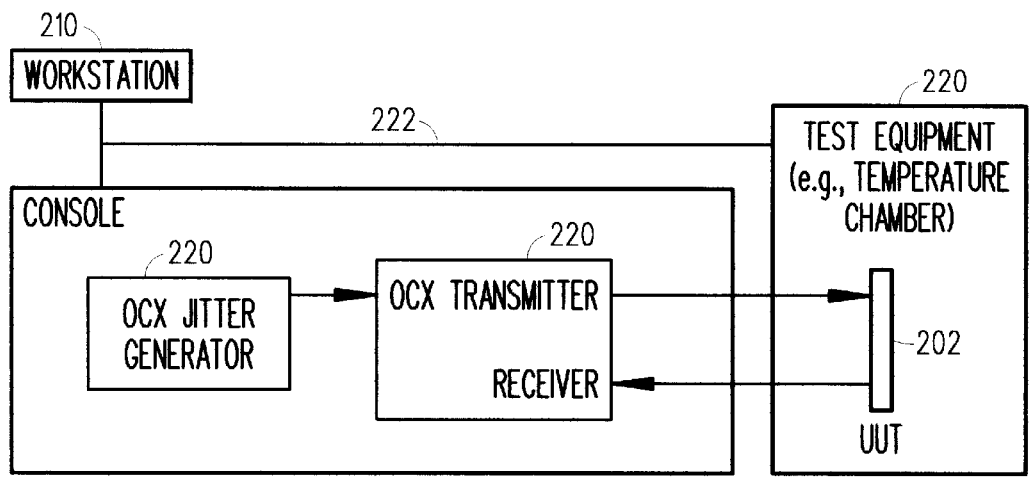
FIG. 13 is a block diagram illustrating a jitter tolerance test setup that can be used to characterize the optical interface board.
Figure 14:
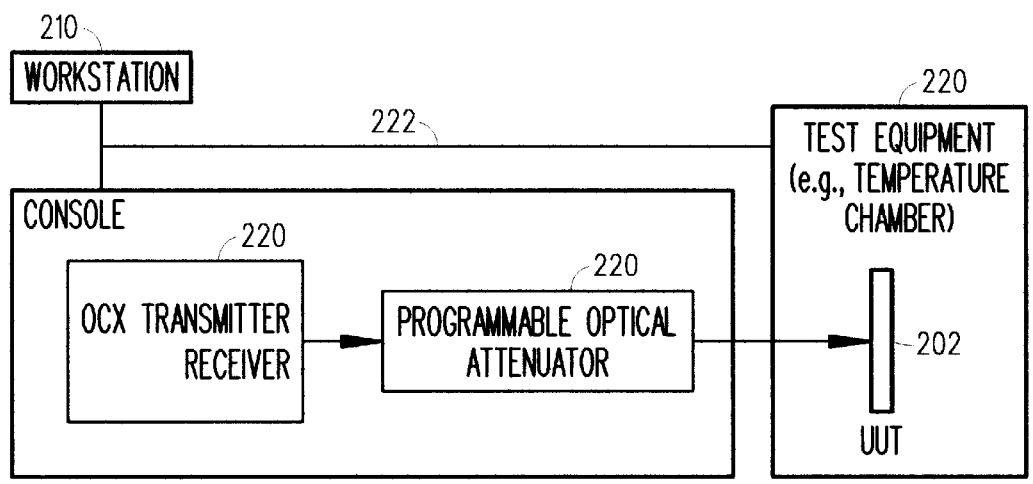
FIG. 14 is a block diagram illustrating an optical LOS alarm test setup that can be used to characterize the optical interface board.

1.2.6.3 Test Procedure:

1) A graph illustrating a Jitter Transfer Mask is illustrated in FIG. 12. And, a jitter transfer test setup is illustrated in FIG. 18.
2) The Jitter test set should be calibrated.
3) No jitter is injected. The jitter generator should be set to allow an accuracy measurement equal to 0.001 UI rms and an accuracy better than +/−5% +/−0.003 UI rms
4) Record the generated rms jitter value.

Although several embodiments of the present invention has been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A method for characterizing a new product, said method comprising the steps of:

testing at least one product under a variety of conditions;

collecting test data in response to testing the at least one product; and analyzing the collected test data to generate a statistical model for making like products that can be provided to a manufacturer who can then use the statistical model to help build and test a plurality of like products, wherein the product is a component in a cross-connect switch.

2. The method of claim 1, wherein said step of collecting the test data further includes the step of checking the validity of the test data.

3. The method of claim 1, wherein said step of testing at least one product further includes the steps of:

configuring at least one piece of test equipment to perform a plurality of tests on the at least one product; and controlling the at least one piece of test equipment to perform the plurality of tests on the at least one product.

4. The method of claim 3, wherein said plurality of tests are defined by a Taguchi Matrix.

5. The method of claim 3, wherein each piece of test equipment is coupled to a work station using a General Purpose Interface Bus.

6. The method of claim 1, wherein said step of analyzing further includes using a graphical programming language to analyze the collected test data and to output a plurality of nominal, lower and upper test conditions that make-up the statistical model.

7. A method for testing a product and generating a statistical model that predicts the permissibility of making like products, said method comprising the steps of:

using a graphical user interface on a workstation to initiate a testing session, wherein the product is automatically tested by the workstation under a variety of conditions, said testing step further includes selecting at least one type of equipment to be tested from a plurality of types of equipment;

selecting one or more tests to be performed;

automatically configuring at least one piece of test equipment to perform the one or more tests on the product by the workstation in response to user input to the graphical user interface, and automatically controlling the at least one piece of test equipment to perfom the plurality of tests on the product by the workstaton in response to user input to the graphical user interface; and obtaining the test data generated in response to performing the plurality of tests on the product and storing the data in a database by the workstation; and using an automated program that reads the data stored in the database and analyzes the obtained test data to generate the statistical model that includes a plurality of nominal, lower and upper test conditions which can be provided to a manufacturer who can then use the statistical model to help build and test a plurality of like products.

8. The method of claim 7, wherein said step of collecting further includes the step of checking the validity of the test data.

9. The method of claim 7, wherein said plurality of tests are defined by a Taguchi Matrix.

10. The method of claim 7, wherein each piece of test equipment is coupled to the work station using a General Purpose Interface Bus.

11. A computer program product, in at least one computer-readable medium, that when executed by a computer, enables the computer to perform certain acts, the computer program product including:

functional descriptive material that generates a graghical user interface for receiving user input;

functional descriptive material that receives hardware type and configuration information in response to the user input for a piece of hardware to be tested;

functional descriptive material that defines one or more tests that may be selected by a user to test the hardware;

functional descriptive material that interfaces with and controls different pieces of test equipment and configures test equipment in response to user input to perform the one or more selected tests;

functional descriptive material that stores data collected during the one or more tests in a database; and functional descriptive material that analyzes the test data and generates a statistical model of the hardware.

12. The computer program product of claim 11, further comprising:

functional descriptive material that assists in communication between the computer program and the hardware being tested and various pieces of test equipment.

13. The computer program product of claim 12, further comprising:

functional descriptive material that assists a user to select files in the database to store data collected during a test.

14. A method in currently executing process in a data processing system, the method comprising:

displaying a graphical user interface, wherein the graphical user interface can receive user input;

selecting a type of product to be tested;

selecting one or more predefined tests to perform on the product in response to user input;

controlling test equipment to perform the one or more predefined tests on the product;

collecting and storing data generated during the one or more product tests in a database; and reading the data stored in the database and analyzing the obtained test data to generate a statistical model that includes a plurality of nominal, lower and upper test conditions.

15. The method of claim 14, wherein the types of products that can be selected for testing include an electrical interface board and an optical interface board.

* * * * *